US012107525B1

(12) United States Patent
Rudiak et al.

(10) Patent No.: US 12,107,525 B1
(45) Date of Patent: Oct. 1, 2024

(54) POWER MODULE WITH SEGMENTED OUTPUT DRIVER (71) Applicant: NXP USA, Inc., Austin, TX (US)

(72) Inventors: Jerry Rudiak, Phoenix, AZ (US); Ibrahim Shihadeh Kandah, Novi, MI (US); Fred T. Brauchler, Canton, MI (US)

(73) Assignee: NXP USA, Inc., Austin, TX (US)

( * ) Notice: Subject to any disclaimer, the term of this patent is extended or adjusted under 35 U.S.C. 154(b) by 24 days.

(21) Appl. No.: 18/313,891

(22) Filed: May 8, 2023

(51) Int. Cl.
H02P 27/08 (2006.01)
B60L 50/51 (2019.01)

(52) U.S. Cl.
CPC ............ H02P 27/08 (2013.01); B60L 50/51 (2019.02); B60L 2210/40 (2013.01)

(58) Field of Classification Search
CPC ....... H02P 27/08; B60L 50/51; B60L 2210/40
USPC .................................................. 307/9.1, 10.1
See application file for complete search history.

(56) References Cited

U.S. PATENT DOCUMENTS

| 10,305,472 | B1 * | 5/2019 | Kinzer | ............... | H02M 3/1588 |
| 10,404,251 | B2 * | 9/2019 | Chen | .................... | H03K 17/063 |
| 10,608,625 | B1 * | 3/2020 | Bernacchia | .......... | H03K 17/163 |
| 2019/0158086 | A1 | 5/2019 | Kinzer et al. | | |

FOREIGN PATENT DOCUMENTS

| CN | 109314457 A | 2/2019 |
| EP | 3627703 A1 | 9/2019 |
| WO | WO-2015116924 A1 | 8/2015 |

OTHER PUBLICATIONS

Fomani, Armin A. et al., "An Integrated Segmented Gate Driver with Adjustable Driving Capability," 2010 IEEE Energy Conversion Congress and Exposition, Atlanta, GA, USA, 2010, pp. 2430-2433.
Fomani, Armin A., "An Integrated Segmented Gate Driver with Adjustable Driving Capability for Efficiency Optimization", Thesis—University of Toronto Graduate Department of Electrical and Computer Engineeri, Jun. 2010, 93 pages.
Hoene, Eckart et al., "Embedded Very Fast Switching Module for SiC Power MOSFETs", ResearchGate, May 2015, 8 pages.
Ludecke, Christoph et al., "Balancing the Switching Losses of Paralleled SiC MOSFETs Using an Intelligent Gate Driver", RWTH Aachen University, Institute for Power Electronics and Electrical Drives, 2020, 7 pages.
Yu, Jingshu, "A Segmented Output Stage H-Bridge IC with Tunable Gate Driver", Thesis, University of Toronto Graduate Department of Electrical and Computer Engineering, Jun. 2014, 69 pages.

* cited by examiner

Primary Examiner — Hal Kaplan
(74) Attorney, Agent, or Firm — Andrew C. Milhollin (57) ABSTRACT A power module may include multiple transistors each respectively having a first current-carrying terminal coupled to a voltage supply, a second current-carrying terminal coupled to an output node, and a control terminal, multiple output driver stages each coupled to the control terminal of a respectively different transistor of the transistors, and a driver module. The driver module may include multiple pre-drivers each coupled to a respectively different output driver stage of the output driver stages and a control module having an input and having multiple outputs coupled to the pre-drivers. The control module may be configured to receive a control signal at the input and to selectively control the pre-drivers to drive at least a subset of the plurality of transistors via the output driver stages based on the control signal.

20 Claims, 6 Drawing Sheets

POWER MODULE WITH SEGMENTED OUTPUT DRIVER

TECHNICAL FIELD

Embodiments of the subject matter described herein relate generally to power modules, including power modules with segmented output drivers.

BACKGROUND

Semiconductor devices find application in a wide variety of electronic components and systems. For example, semiconductor-based power modules are commonly used in traction inverters for electric vehicles. Such traction inverters may convert a direct current (DC) voltage output by a battery to an alternating current (AC) signal with current that is sufficiently high to drive an electric motor of a corresponding vehicle. Traction inverters for electric vehicles tend to have high switching speed requirements, and their switching performance may be negatively impacted by parasitic resistance and inductance that typically occurs at their drivers.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a power module includes a plurality of transistors, a plurality of output driver stages, and a driver module. Each of the plurality of transistors respectively has a first current-carrying terminal coupled to a voltage supply, a second current-carrying terminal coupled to an output node, and a control terminal. Each of the plurality of output driver stages is coupled to the control terminal of a respectively different transistor of the plurality of transistors. The driver module includes a plurality of pre-drivers each coupled to a respectively different output driver stage of the plurality of output driver stages, and a control module having an input and having a plurality of outputs coupled to the plurality of pre-drivers. The control module is configured to receive a control signal at the input and to selectively control the plurality of pre-drivers to drive at least a subset of the plurality of transistors via the plurality of output driver stages based on the control signal.

In one or more embodiments, the control module is configured to receive the control signal from a signal source that is separate from the power module.

In one or more embodiments, the control module determines the subset of the plurality of transistors to be driven, a state in which each of the subset of the plurality of transistors is to be driven, and an amount of drive current to be applied when driving the subset of the plurality of transistors based on a signal level of the control signal.

In one or more embodiments, the signal level of the control signal is a voltage level of the control signal, and the control signal is a pulse width modulation signal.

In one or more embodiments, the control module includes a plurality of window comparators configured to receive the pulse width modulation signal and a decoder configured to receive one or more outputs from the plurality of window comparators, and to determine the subset of the plurality of transistors to be driven, a state in which each of the subset of the plurality of transistors is to be driven, and an amount of drive current to be applied when driving the subset of the plurality of transistors based on the one or more outputs of the plurality of window comparators.

In one or more embodiments, the signal level of the control signal is a current level of the control signal.

In one or more embodiments, the control module includes a polarity detector configured to determine a polarity of the control signal, a current detector configured to determine the current level of the control signal, and logic circuitry configured to control the pre-drivers based on the current level and the polarity.

In one or more embodiments, the pre-drivers including a plurality of current mirrors, and the logic circuitry is configured to selectively activate outputs of the plurality of current mirrors based on the current level.

In an example embodiment, a power inverter includes a driver control module and a power module. The driver control module includes communication circuitry configured to output a control signal. The power module includes a plurality of transistors each respectively having a first current-carrying terminal coupled to a voltage supply, a second current-carrying terminal coupled to an output node, and a control terminal, a plurality of output driver stages each coupled to the control terminal of a respectively different transistor of the plurality of transistors, and a driver control module coupled to the plurality of output driver stages. The driver module is configured to receive the control signal from the communication circuitry and to drive at least a subset of the plurality of transistors via the plurality of output driver stages based on the control signal.

In one or more embodiments, the driver module includes a plurality of pre-drivers each coupled to a respectively different output driver stage of the plurality of output driver stages, and a control module having an input and having a plurality of outputs coupled to the plurality of pre-drivers. The control module is configured to receive the control signal at the input and to selectively control the plurality of pre-drivers to drive the subset of the plurality of transistors via the plurality of output driver stages based on the control signal.

In one or more embodiments, the control module is configured to determine the subset of the plurality of transistors to be driven, a state in which each of the subset of the plurality of transistors is to be driven, and an amount of drive current to be applied when driving the subset of the plurality of transistors based on a signal level of the control signal.

In one or more embodiments, the signal level of the control signal is a voltage level of the control signal, and the control signal is a pulse width modulation signal.

In one or more embodiments, the control module includes a plurality of window comparators configured to receive the pulse width modulation signal, and a decoder configured to receive one or more outputs from the plurality of window comparators, and to determine the subset of the plurality of transistors to be driven, a state in which each of the subset of the plurality of transistors is to be driven, and an amount of drive current to be applied when driving the subset of the plurality of transistors based on the one or more outputs of the plurality of window comparators.

In one or more embodiments, the signal level of the control signal is a current level of the control signal.

In one or more embodiments, the control module includes a polarity detector configured to determine a polarity of the control signal, a current detector configured to determine the current level of the control signal, and logic circuitry configured to control the pre-drivers based on the current level and the polarity.

In one or more embodiments, the pre-drivers including a plurality of current mirrors, and the logic circuitry is configured to selectively activate outputs of the plurality of current mirrors based on the current level.

In an example embodiment, a traction inverter for an electric vehicle includes a motor, a plurality of power inverters collectively configured to supply three phase power to the motor. Each of the plurality of power inverters includes a first driver control module having first communication circuitry configured to output a first control signal, and a first power module. The first power module includes a first plurality of transistors each respectively having a first current-carrying terminal coupled to a first voltage supply, a second current-carrying terminal coupled to an output node, and a first control terminal, a first plurality of output driver stages each coupled to the first control terminal of a respectively different transistor of the first plurality of transistors, and a first driver module coupled to the first plurality of output driver stages. The first driver module is configured to receive the first control signal from the first communication circuitry and to drive at least a subset of the first plurality of transistors via the first plurality of output driver stages based on the first control signal.

In one or more embodiments, the first driver module includes a plurality of pre-drivers each coupled to a respectively different output driver stage of the first plurality of output driver stages, and a control module having an input and having a plurality of outputs coupled to the plurality of pre-drivers. The control module is configured to receive the first control signal at the input and to selectively control the plurality of pre-drivers to drive the subset of the first plurality of transistors via the first plurality of output driver stages based on the first control signal.

In one or more embodiments, the control module determines the subset of the first plurality of transistors to be driven, a state in which each of the subset of the first plurality of transistors is to be driven, and an amount of drive current to be applied when driving the subset of the first plurality of transistors based on a signal level of the first control signal.

In one or more embodiments, each of the plurality of power inverters has a half bridge configuration. Each of the plurality of power inverters further includes a second driver control module having second communication circuitry configured to output a second control signal and a second power module. The second power module includes a second plurality of transistors each respectively having a third current-carrying terminal coupled to a second voltage supply, a fourth current-carrying terminal coupled to the output node, and a second control terminal, a second plurality of output driver stages each coupled to the second control terminal of a respectively different transistor of the second plurality of transistors, and a second driver module coupled to the second plurality of output driver stages. The second driver module is configured to receive the second control signal from the second communication circuitry and to drive at least a subset of the second plurality of transistors via the second plurality of output driver stages based on the second control signal.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated into and form part of the specification and serve to further illustrate examples, embodiments and the like, and explain various principles and advantages, in accordance with the present disclosure, wherein:

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted for sake of brevity. Additionally, elements in the drawing figures are not necessarily drawn to scale. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to a power module that includes a segmented output driver. In one or more embodiments, the power module may include a driver module and multiple segments, each segment including an output driver stage and a transistor, where each transistor is coupled to between a voltage supply and an output of the power module. The driver module may include a control module and multiple pre-drivers (one for each segment). The control module may measure one or more signal characteristics (e.g., voltage level, current level, polarity, or other suitable signal characteristics) of control signals received from an external signal source to determine which of the transistors are to be driven, the drive current to be used when driving those transistors, and whether those transistors are to be driven in an 'on' state or an 'off' state. In one or more embodiments, the signal source is disposed in a package or module that is separate from the power module. In one or more embodiments, the control signal output by the signal source is a pulse width modulation signal. In one or more other embodiments, the control signal output by the signal source is a direct current signal. In one or more embodiments, the control signals are conveyed to the driver control module of the power module from the signal source via a single signal pin, which may advantageously reduce the number of signal pins required by the power module (e.g., compared to conventional approaches).

By including output driver stages directly in the power module 120 and directly coupled to control terminals of the transistors of the power module, switching speed of the power module may be advantageously improved due, at least in part, to reduced impedance between the output driver stages and the transistors compared to conventional approaches in which drivers are implemented entirely outside of the power module 120.

In one or more embodiments, the power module may be configured as a power inverter that converts at least one direct current (DC) signal to an alternating current (AC) signal. The power module may include a half-bridge arrangement having high side circuitry that includes a first driver module, a first set of transistors arranged in parallel, and a first segmented driver that includes a first set of output driver stages each disposed at a respectively different transistor of the first set of transistors, and having low side circuitry that includes second driver module, a second set of transistors arranged in parallel, and a second segmented driver that includes a second set of output driver stages each disposed at a respectively different transistor of the second set of transistors. The first driver module may selectively drive one or more of the first output driver stages to control the first set of transistors based on first control signals received from a first external signal source. The second driver module may selectively drive one or more of the of the second output driver stages to control the second set of transistors based on second control signals received from a second external signal source. In one or more embodiments, a traction inverter may include three such power modules collectively configured to provide three phase power to a motor, such that the voltage and current of the output signal of each power module of the traction inverter is at or around 120 degrees out of phase with the voltage and current of each other power module of the traction inverter.

Figure 1:
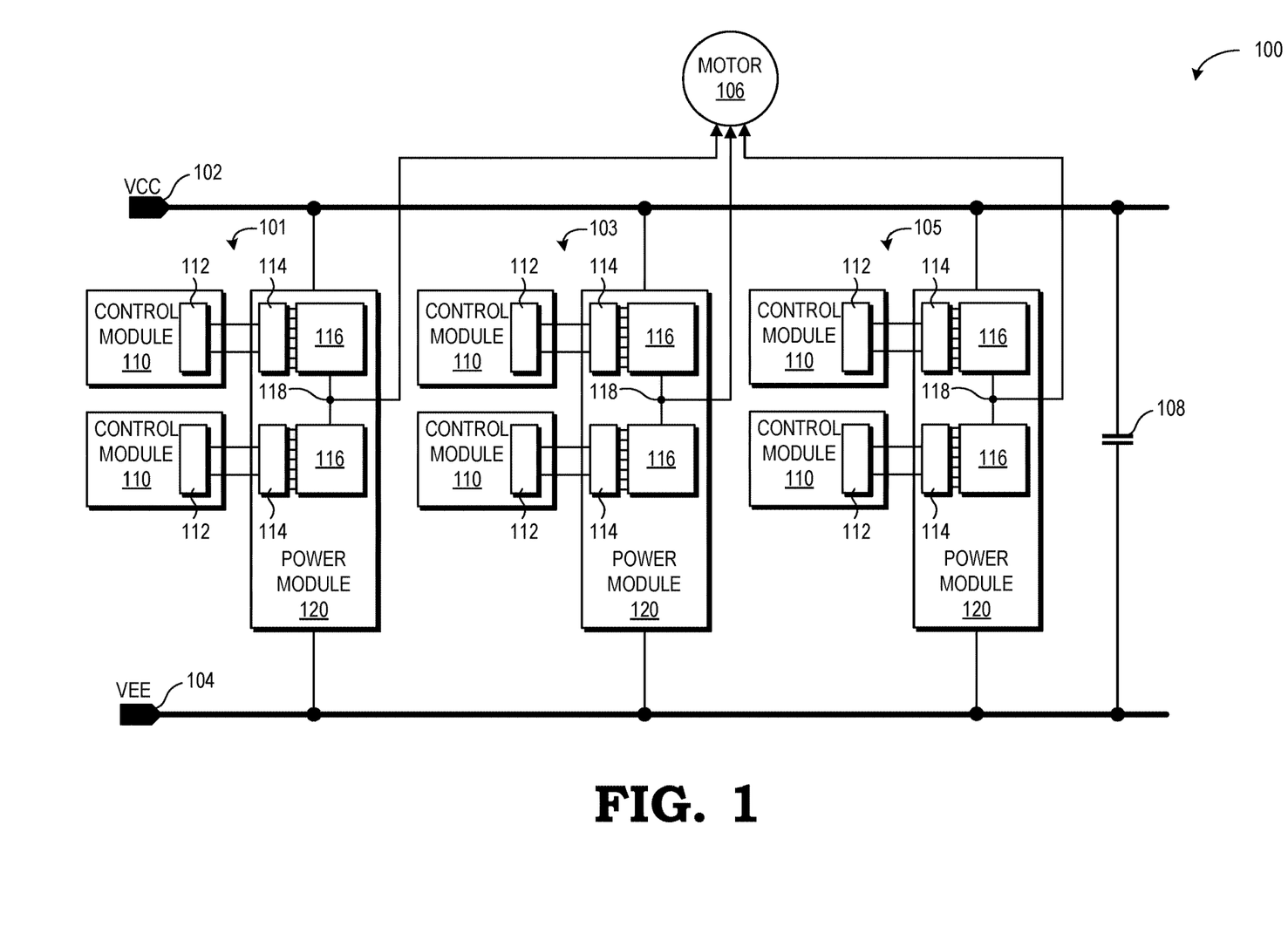
FIG. 1 is a block diagram illustrating a traction inverter configured to drive a motor, where the traction inverter includes power modules with segmented output drivers, in accordance with various embodiments.

FIG. 1 is a block diagram of control circuitry a 3-phase traction inverter 100 that may be included, for example, in an electric vehicle. The traction inverter 100 includes a first inverter circuit 101, a second inverter circuit 103, a third inverter circuit 105, and at least one DC link capacitor 108 all coupled in parallel between a positive voltage supply 102 configured to provide a positive DC voltage $V_{CC}$ (e.g., around 400 V to around 800 V according to one or more embodiments) and a negative voltage supply 104 configured to provide a negative DC voltage $V_{EE}$. (e.g., around 0 V; ground relative to $V_{CC}$). Each of the inverter circuits 101, 103, 105 may be configured to output a respective AC signal to a motor 106. In one or more embodiments, the motor 106 may be a traction motor for an electric vehicle. The respective phase of each AC signal output by each of the inverter circuits 101, 103, 105 may be offset from the phase of each other AC signal by at or around 120°. For example, the first inverter circuit 101 may be configured to output a first AC signal having a first phase, the second inverter circuit 103 may be configured to output a second AC signal having a second phase that is 120° greater than the first phase, and the third inverter circuit 105 may be configured to output a third AC signal having a third phase that is 120° greater than the second phase. Herein, an example amount that is said to be "around" or "approximately" a given value is considered to be within +/−10% of the given value unless otherwise indicated.

Each of the inverter circuits 101, 103, 105, may respectively include two driver control modules 110 and a power module 120. Each driver control module 110 may include communication circuitry 112. Each power module 120 may include two driver modules 114 and two output stages 116. For example, each of the inverter circuits 101, 103, 105 may have a half bridge configuration that may be logically divided into a "high side" (including circuitry coupled between the positive voltage supply 102 and the output node 118) and a "low side" (including circuitry coupled between the negative voltage supply 104 and the output node 118). For example, the high side of each of the inverter circuits 101, 103, 105 includes one of each of the driver control modules 110, the driver modules 114, and the output stages 116. The low side of each of the inverter circuits 101, 103, 105 includes one of each of the driver control modules 110, the driver modules 114, and the output stages 116. Each output stage 116 may include a set of transistors arranged in parallel and multiple segmented output driver stages, where one such output driver stage is associated with and coupled to a gate terminal of a corresponding transistor of the set of transistors. Each output stage 116 included at the high side may be coupled between the positive voltage supply 102 and an output node 118 of the corresponding power module 120. Each output stage 116 included at the low side may be coupled between the negative voltage supply 104 and the output node 118.

While the present example shows power modules 120 that include two output stage 116 and two driver modules 114 that are coupled to two driver control modules 110, it should be understood that this arrangement is intended to be illustrative and not limiting. That is, power modules 120 with more or fewer driver modules 114 and output stages 116 and coupled to more or fewer driver control modules 110 may be used in accordance with one or more other embodiments. For example, in one or more such embodiments, a power module 120 may include a single output stage 116 that is coupled to a single driver module 114, and the driver 114 may be coupled to a single driver control module 110.

The communication circuitry 112 of the driver control module 110 may include a signal source or may be coupled to an external signal source, in accordance with various embodiments. The signal source may be configured to generate control signals, such as variable current signals or pulse width modulation (PWM) signals, in accordance with various embodiments. The communication circuitry 112 may be configured to output the control signals generated by the signal source to a driver module 114 on the power module 120. The driver module 114 may include a decoder that is configured to analyze (e.g., decode) the control signals received from the communication circuitry 112 and corresponding logic circuitry configured to selectively drive segmented output driver stages in the corresponding output stage 116 based on one or more aspects of the control signals.

Each output stage 116 may include a set of transistors arranged in parallel and segmented output driver stages, where each transistor of the set of transistors includes a gate terminal (sometimes referred to as a "control terminal" herein) that is coupled to a respectively different driver stage of the segmented output driver stages. Each driver stage may be configured to drive the transistor to which it corresponds in an 'on' state or an 'off' state based on signals received by that driver stage from the driver module 114, where the driver module 114 determines whether to drive the driver stage in the 'on' state or the 'off' state based on signals it receives from the driver control module 110. Each transistor of a given output stage 116, upon being driven in an 'on' state, may allow electric current to flow from a voltage supply (e.g., the positive voltage supply 102 or the negative voltage supply 104) coupled to the drain or source terminal (sometimes referred to as "current-carrying terminals" herein) of that transistor to the output node 118. Each transistor of a given output stage 116, upon being driven in an 'off' state, may prevent the flow of electric current from a voltage supply (e.g., the positive voltage supply 102 or the negative voltage supply 104) coupled to the drain or source terminal of that transistor to the output node 118.

Conventional power modules are typically implemented with output driver circuitry that is packaged separately from such power modules. However, impedances between such external output driver circuitry and these conventional power modules may undesirably have a negative impact on switching performance of the conventional power modules. For example, power loss due to switching (i.e., "switching loss") is typically inversely related to switching speed, such a switching arrangement with faster switching speed exhibits less switching loss, while a switching arrangement with slower switching speed exhibits greater switching loss.

In the present example, at least a portion of the output driver is implemented in the power modules 120 (e.g., via the driver modules 114 and segmented output driver stages included in the output stages 116). Impedances seen at the gates of output driver stage transistors of the output stages 116 may be reduced by around 50% or more by implementing the driver modules 114 inside the package of the power module 120, rather than implementing the driver modules out of package. This reduced gate impedance allows for current to flow faster into and out of the gates of the transistors of the output stages 116, allowing for faster switching transitions. Thus, the switching performance of the power module 120 may be improved by including some or all of the output driver circuitry (e.g., the driver modules 114) within the power module 120, at least because the impedance (primarily inductance, which tends to limit the rate at which the gate can be charged) of a given connection between two components or die within the power module 120 is typically less than the impedance of a connection between the power module and an external device.

Figure 2:
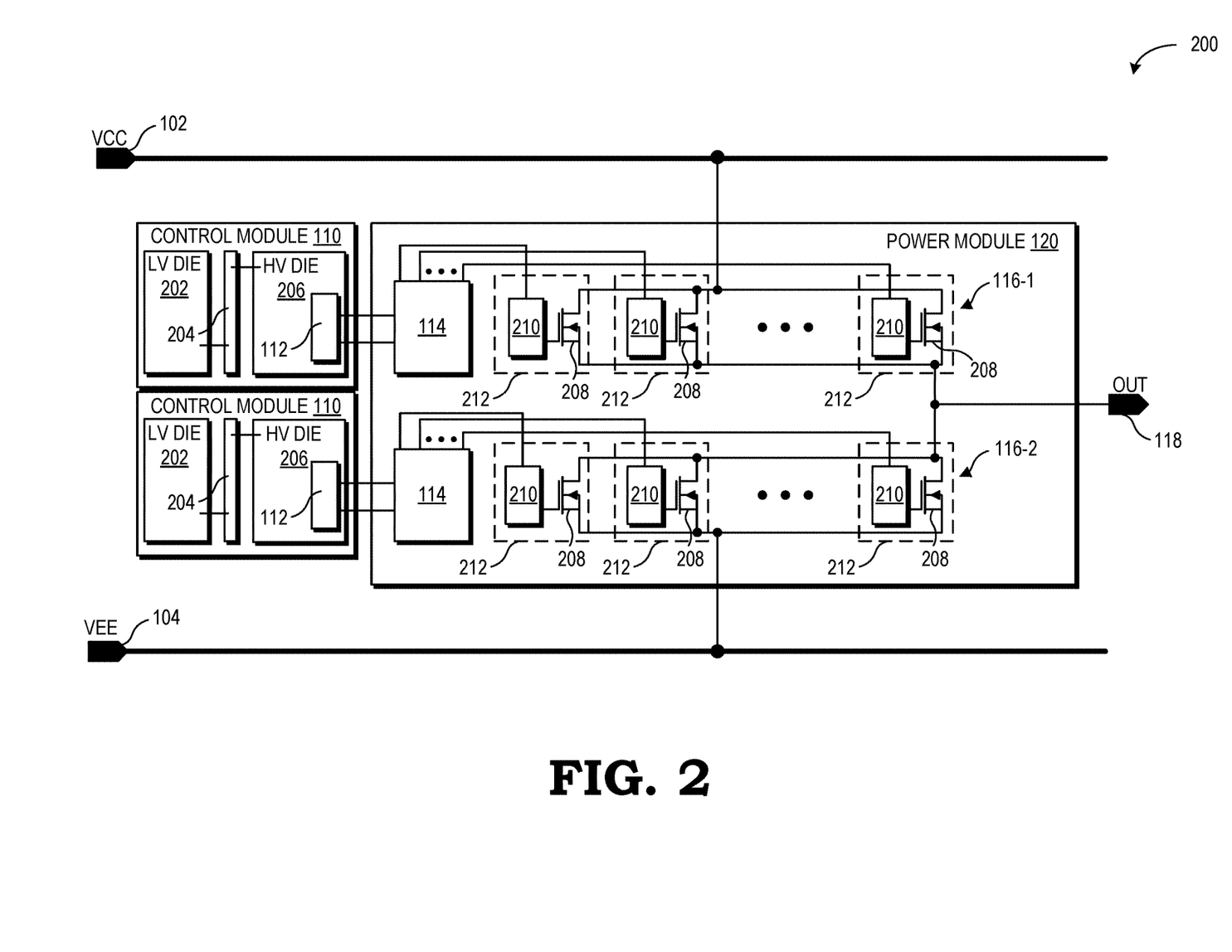
FIG. 2 is a block diagrams illustrating a power module and corresponding driver control modules that may be used, for example, in the traction inverter of FIG. 1, in accordance with various embodiments.

FIG. 2 shows an example of a power inverter 200 that includes a power module 120 with segmented output driver stages 210 (sometimes referred to as "segmented drivers 210"). In one or more embodiments, the power inverter 200 may correspond to an embodiment of any of the inverter circuits 101, 103, 105 of FIG. 1, as a non-limiting example. One or more elements of the power inverter 200 may correspond to similar elements described above with reference to FIG. 1, where such like elements are denoted using like reference numerals in the present example. Aspects of such elements that are already described above may not necessarily be repeated here for sake of brevity.

In the present example, each of the driver control modules 110 includes a low voltage die 202, an isolation die 204, and a high voltage die 206. The high voltage die 206 includes communication circuitry 112, which is coupled to the power module 120. Each power module 120 includes a driver module 114 and an output stage 116 (separately denoted here as 116-1 and 116-2). Each output stage 116 includes multiple transistors 208 coupled in parallel between the output node 118 and either the positive voltage supply 102 (e.g., in the case of the output stage 116-1) or the negative voltage supply 104 (e.g., in the case of the output stage 116-2). The transistors 208 may be metal oxide semiconductor field effect transistors (MOSFETs) in one or more embodiments. The transistors 208 may be silicon carbide (SiC) or gallium nitride (GaN) based MOSFETs, as non-limiting examples. Each output stage 116 includes segmented output driver stages 210. Each of the output driver stages 210 may be implemented as current mode drivers, voltage mode drivers, as non-limiting examples. Each corresponding pair of output driver stage 210 and transistor 208 may be logically grouped into a segment 212, where each output stage 116 includes multiple segments 212 that are each coupled between the output node 118 and either the positive voltage supply 102 (e.g., for the segments 212 of the output stage 116-1) or the negative voltage supply 104 (e.g., for the segments 212 of the output stage 116-2).

In one or more embodiments, each of the transistors 208 is formed on a respective semiconductor (e.g., SiC or GaN as non-limiting examples) die that is separate from the die on which the other transistors 208 are formed. In one or more embodiments, each of the output driver stages 210 is formed on a semiconductor die (e.g., Si, SiC, or GaN as non-limiting examples) die that is separate from the die on which the other output driver stages 210 are formed. In one or more embodiments, each corresponding pair of output driver stage 210 and transistor 208 may be formed on the same semiconductor (e.g., Sic or GaN as non-limiting examples) die.

Each of the driver modules 114 may include one or more inputs coupled to the communication circuitry 112 of the corresponding driver control module 110. Outputs of each driver module 114 may be coupled to respective output driver stages 210 of the corresponding output stage 116. Each of the output driver stages 210 includes at least one input coupled to at least one output of the driver module 114 and an output coupled to gate terminal (i.e., control terminal) of a respective transistor 208. In one or more embodiments, the transistors 208 themselves are configured as an output stage, in which case the output driver stages 210 may be configured as predrivers for the transistors 208.

In one or more embodiments, each communication circuitry 112 is configured to receive or generate one or more control signals. For example, the communication circuitry 112 may generate control signals based on instructions received from a computer processor (e.g., microprocessor), which may be implemented on or coupled to the low voltage die 202, in accordance with various embodiments. In one or more embodiments, the communication circuitry 112 is configured to then output such control signals to the driver module 114 (e.g., via a high impedance connection in one or more embodiments). The driver module 114 is configured to drive each of the output driver stages 210 based on one or more aspects (e.g., current level or voltage level as non-limiting examples) of the control signals it receives from the communication circuitry 112. For example, the driver module 114 may selectively drive each of the output driver stages 210 individually, such that the driver module 114 may independently control each of the transistors 208 of the particular output stage 116 to which it is coupled. For example, the driver module 114 may be configured to determine, based on the one or more control signals received from the communication circuitry 112, which of the transistors 208 are to be driven, the state in which those transistors are to be driven (e.g., in an 'on' state or an 'off' state), and the drive current to be supplied when driving those transistors (e.g., which may be represented as a percentage of maximum drive current), and to then control the output driver stages 210 to drive the identified transistors 208 in the determined state using the determined drive current. In one or more embodiments, the control signals may be provided from the communication circuitry 112 to the driver module 114 using a single signal line (rather than multiple signal lines; not including ground). As will be described, in one or more embodiments a single control signal provided by the communication circuitry 112 and received by the driver module 114 may be used by the driver module 114 to determine which of the transistors 208 are to be driven, the state in which those transistors are to be driven, and the drive current to be supplied when driving those transistors.

It is generally desirable for power modules, such as the power module 120, to have a minimal number of pins. Conventional power modules typically include a gate pin, a ground pin, a reference pin, collector sense pin, and at least one signal input pin per individually controllable power device (e.g., power transistor) or group of power devices. In applications having a higher number of power devices in parallel, it may be advantageous to control each of the parallel power devices independently, which would add to the required number of pins in conventional power modules.

In contrast, embodiments of the power module 120 can selectively, independently control multiple power devices based on a single control signal (e.g., SIG in FIG. 3, $V_{PWM}$ in FIG. 4, $I_{CTRL}$ in FIG. 5), without the need for additional pins. Further, by advantageously placing predrivers and output driver stages close to corresponding power devices (i.e., the transistors 208) to minimize parasitics (e.g., reducing impedances seen at the gates of the transistors 208), switching speed of the power module 120 may be improved.

Figure 3:
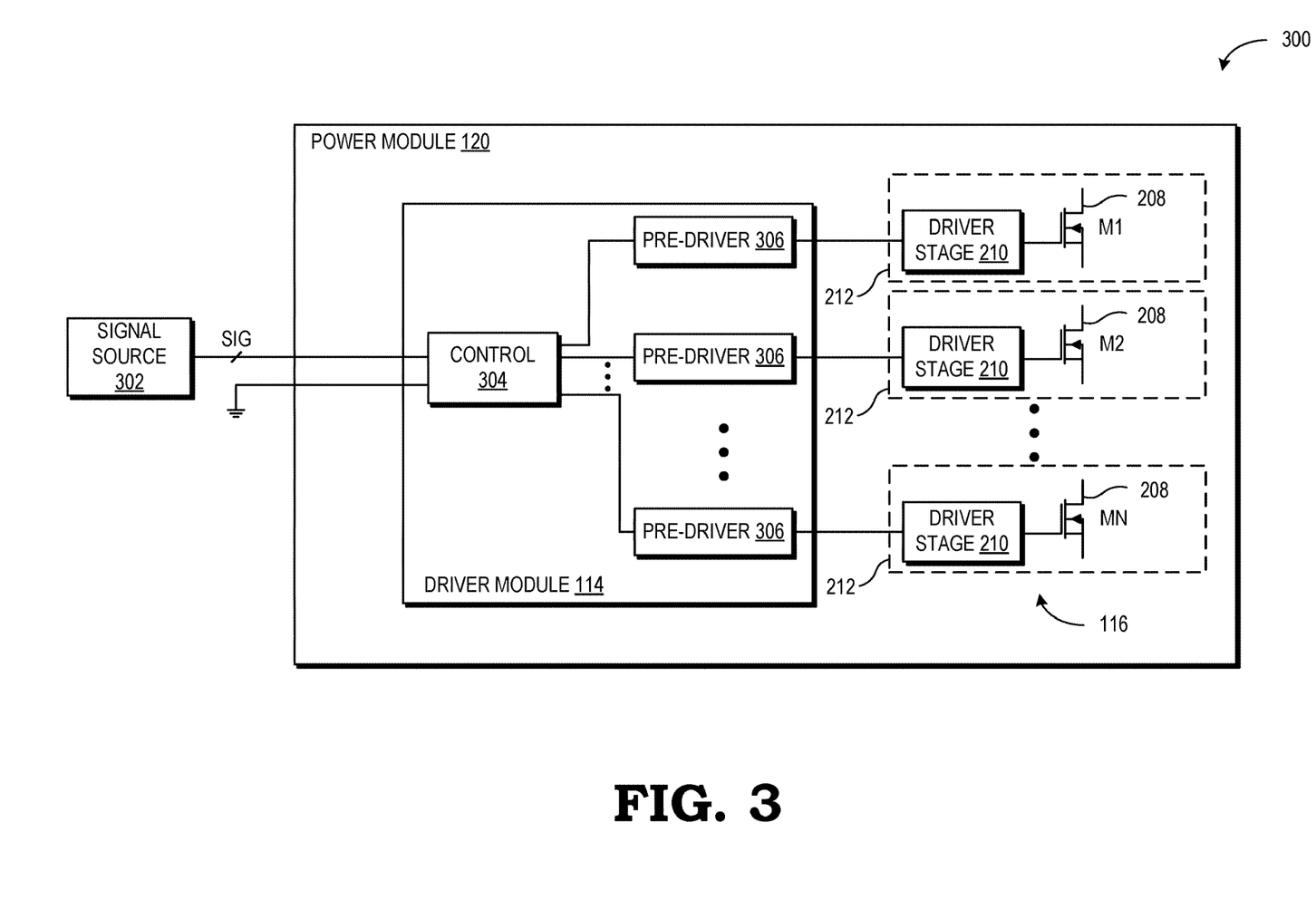
FIG. 3 is a block diagram illustrating circuitry that includes a driver module configured to control segmented output driver stages for a set of output transistors arranged in parallel, in accordance with various embodiments.

FIG. 3 shows an example of circuitry 300 that includes a power module having segmented output driver stages. One or more elements of the circuitry 300 may correspond to similar elements described above with reference to FIGS. 1 and 2, where such like elements are denoted using like reference numerals in the present example. Aspects of such elements that are already described above may not necessarily be repeated here for sake of brevity. For example, the power module 120 of the circuitry 300 may correspond to an example embodiment of the power module 120 of FIGS. 1 and 2. As another example, the signal source 302 may correspond to an example embodiment of the communication circuitry 112 of FIGS. 1 and 2.

In the present example, the power module 120 includes a driver module 114 and an output stage 116 having multiple segments 212, each including an output driver stage 210 and a transistor 208. The driver module 114 may include a control module 304 and pre-drivers 306, where each pre-driver 306 is coupled to a respectively different segment 212. For example, the power module 120 may include N pre-drivers 306 in the driver module 114, N segments 212, N output driver stages 210, and N transistors 208 (denoted M1, M2 . . . . MN), where N is a non-zero positive integer. In accordance with various embodiments, the driver stages 210 may be current mode drivers or voltage mode drivers, as non-limiting examples. Each of the transistors 208 may include a control terminal (e.g., gate terminal) coupled a respective output driver stage of the output driver stages 210, a first current-carrying terminal (e.g., a source terminal or a drain terminal) coupled to a voltage supply (e.g., the voltage supplies 102, 104, FIGS. 1, 2) and a second current-carrying terminal (e.g., a source terminal or a drain terminal) coupled to an output node (e.g., the output node 118, FIGS. 1, 2).

The control module 304 may be configured to receive a control signal SIG from a signal source 302. In accordance with various embodiments, the control module 304 may include a voltage divider, a voltage detector configured to determine (i.e., measure) the voltage of the control signal SIG, a current detector configured to determine (i.e., measure) the current of the control signal SIG, one or more window comparators each configured to compare the voltage of the control signal SIG to a respective voltage window, a polarity detector configured to determine a polarity (positive or negative) of the control signal SIG, logic circuitry configured to control the pre-drivers 406 based on signal characteristics of the control signal SIG, or any suitable combination of these, as non-limiting examples.

The signal source 302 may be an "external" signal source, at least in that the signal source 302 may be disposed in a package or module that is separate from the power module 120. In one or more embodiments, the signal source 302 may be configured to generate a pulse width modulation (PWM) signal as the control signal SIG. In one or more other embodiments, the signal source 302 may be configured to generate a direct current (DC) signal as the control signal SIG.

The signal source 302 may be configured to generate the control signal SIG to have one or more signal characteristics (e.g., voltage level, current level, polarity, or the like) based on which of the transistors 208 are to be driven, the state in which those transistors are to be driven, and the drive current to be used when driving those transistors. The signal source 302 may output the control signal SIG to an input (e.g., a single input terminal) of the control module 304.

The control module 304 may be configured to detect one or more of the signal characteristics (e.g., to detect voltage, current, polarity, or a combination of these) of the control signal SIG, based on which the control module 304 may determine which of the transistors 208 are to be driven, the state in which those transistors are to be driven (an 'on' state or an 'off' state), and the drive current to be used when driving those transistors. The control module 304 may then selectively control the pre-drivers 306 based on the detected signal characteristic(s) of the control signal SIG. Examples of control schemes that may be used by the driver module 114 to selectively drive the transistors 208 based on the control signal SIG are described in connection with FIGS. 4 and 5, below.

Conventional power modules are typically limited to controlling transistors in a given set of parallel transistors concurrently, without individual transistor control. In the present example, the power module can control each driver stage 210 (and, therefore, each transistor 208) individually, at least because the control module 304 is configured to control each pre-driver 306 individually based on the signal level of the control signal SIG. This allows the power module 120 to vary the power of the output signal (i.e., the signal at the output node coupled to each of the transistors 208) by varying the number of transistors that are simultaneously driven in the 'on' state. By selectively controlling the number of transistors 208 that are driven at a given time, switching losses in the power module 120 may be advantageously reduced. For example, at lower signal currents, driving only a single transistor 208 rather than two or more transistors 208 may result in greater power efficiency. Then, for higher signal currents, the power module 120 may selectively drive a greater number of the transistors 208, as needed.

Figure 4:
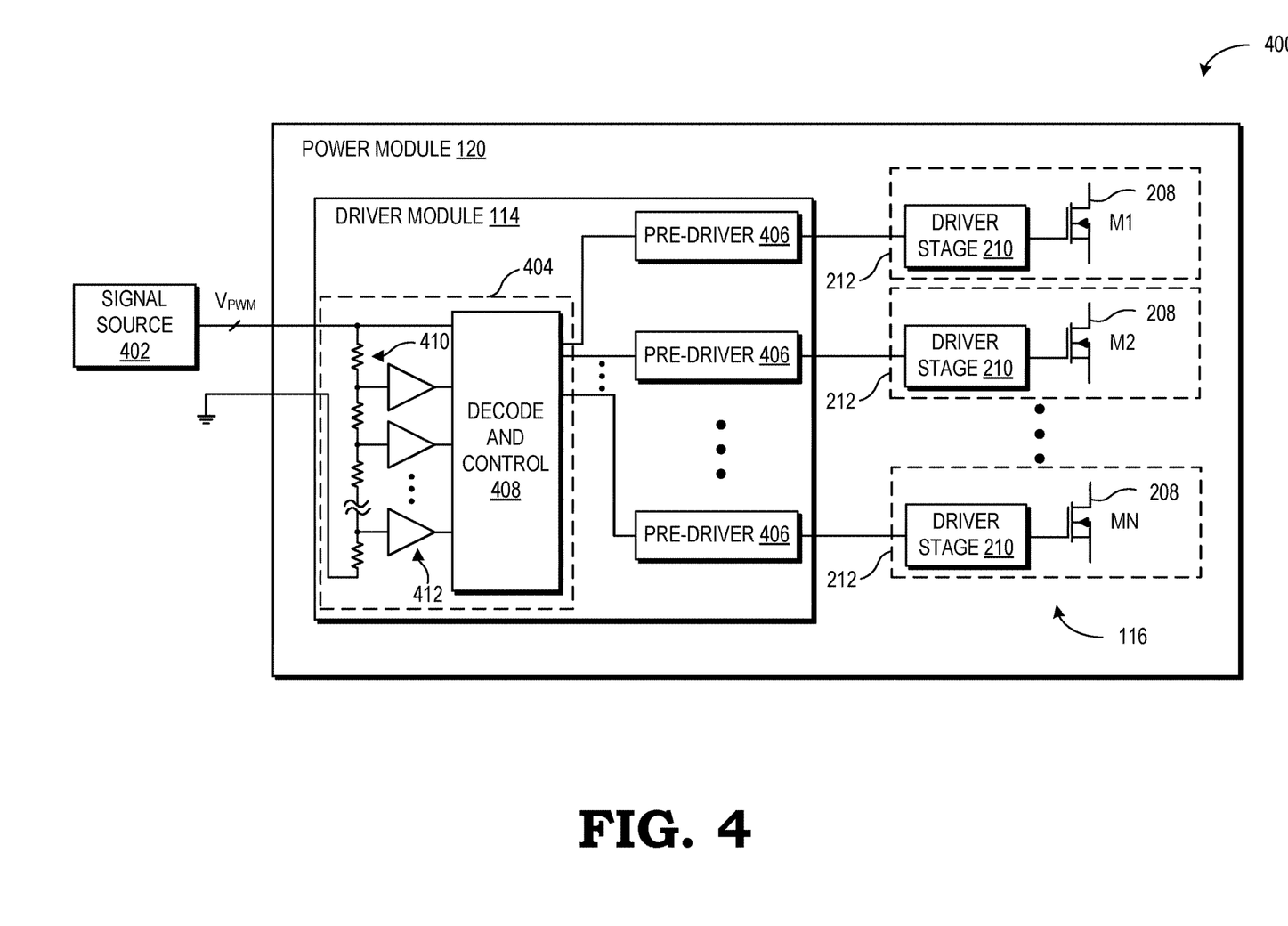
FIG. 4 is a block diagram illustrating circuitry that includes a driver module configured to control segmented output driver stages for a set of output transistors arranged in parallel based on a detected voltage of a received pulse width modulation (PWM) signal, in accordance with various embodiments.

FIG. 4 shows an example of circuitry 400 that includes a power module having segmented output driver stages that are controlled by a control module based on signal characteristics of a control signal that include the control signal voltage level. One or more elements of the circuitry 400 may correspond to similar elements described above with reference to FIGS. 1 and 2, where such like elements are denoted using like reference numerals in the present example. Aspects of such elements that are already described above may not necessarily be repeated here for sake of brevity. For example, the power module 120 of the circuitry 400 may correspond to be an example embodiment of the power module 120 of FIGS. 1, 2, and 3. As another example, the signal source 402 may correspond to an example embodiment of the communication circuitry 112 of FIGS. 1 and 2 or the signal source 302 of FIG. 3.

In the present example, the power module 120 includes a driver module 114 and an output stage 116 having multiple segments 212, each including an output driver stage 210 and a transistor 208. The driver module 114 may include a control module 404 and pre-drivers 406, where each pre-driver 406 is coupled to a respectively different segment 212. For example, the power module 120 may include N pre-drivers 406 in the driver module 114, N segments 212, N driver stages 210, and N transistors 208 (denoted M1, M2 . . . . MN), where N is a non-zero positive integer. In accordance with various embodiments, the driver stages 210 may be current mode drivers or voltage mode drivers, as non-limiting examples. Each of the transistors 208 may include a control terminal (e.g., gate terminal) coupled a respective output driver stage of the output driver stages 210, a first current-carrying terminal (e.g., a source terminal or a drain terminal) coupled to a voltage supply (e.g., the voltage supplies 102, 104, FIGS. 1, 2) and a second current-carrying terminal (e.g., a source terminal or a drain terminal) coupled to an output node (e.g., the output node 118, FIGS. 1, 2).

The control module 404 may be configured to receive a control signal $V_{PWM}$ from a signal source 402. The signal source 402 may be an "external" signal source, at least in that the signal source 402 may be disposed in a package or module that is separate from the power module 120. The signal source 402 may be configured to set the voltage level and polarity at which to generate the control signal $V_{PWM}$ based on which of the transistors 208 are to be driven, the state in which those transistors are to be driven, and the drive current to be used when driving those transistors. The signal source 402 may output the control signal $V_{PWM}$ to an input (e.g., a single input terminal) of the control module 404, corresponding to an input of the voltage divider 410. Based on the detected voltage level and polarity of the control signal $V_{PWM}$, the control module 404 may determine which of the transistors 208 are to be driven, the state in which those transistors are to be driven (an 'on' state or an 'off' state), and the drive current to be used when driving those transistors. The control module 404 may then selectively control the pre-drivers 406 based on the detected voltage level and polarity of the control signal $V_{PWM}$.

For example, the control module 404 may include a voltage divider 410, window comparators 412, and decode and control circuitry 408. The window comparators 412 of the control module 404 may be configured to determine which, if any, of a number of defined voltage windows include voltage level of the control signal $V_{PWM}$. The decode and control circuitry 408 may then be configured to determine which of the transistors 208 are to be driven (e.g., via selective activation of the pre-drivers 406) based on the determination of the voltage window corresponding to the control signal $V_{PWM}$.

The decode and control circuitry 408 may include a voltage detector and corresponding logic circuitry. The voltage detector may determine the voltage level of the control signal $V_{PWM}$, and the corresponding logic circuitry may be configured to determine the drive current to be used when driving the transistors 208 and may control the pre-drivers 406 to supply the determined drive current to the transistors 208.

The decode and control circuitry 408 may include a polarity detector configured to determine the polarity (positive or negative) of the control signal $V_{PWM}$. The decode and control circuitry 408 may cause the transistors 208 to be driven in an 'on' state or an 'off' state based on the determined polarity of the control signal $V_{PWM}$.

It should be understood that the implementation of the control module 404 in the present example is intended to be illustrative and non-limiting. For example, in one or more other embodiments, the control module 404 may use other techniques for determining the voltage level of the control signal $V_{PWM}$, such as analog-to-digital converter (ADC) based techniques.

As a non-limiting example, the control module 404 may be configured to control the pre-drivers 406 to selectively drive one or more of the transistors 208 via the output driver stages 210 in accordance with Table 1, below.

TABLE 1

| $V_{PWM}$ Voltage (V) | Transistors to be Driven | Transistor State | Drive Current (% of Max) |
| --- | --- | --- | --- |
| −3.01 to −4 | M1, M2, M3 | OFF | 1%–100% |
| −2.01 to −3 | M1, M2 | OFF | 1%–100% |
| −1.01 to −2 | M1 | OFF | 1%–100% |
| −1 to 1 | NONE | N/A | NONE |
| 1.01 to 2 | M1 | ON | 1%–100% |
| 2.01 to 3 | M1, M2 | ON | 1%–100% |
| 3.01 to 4 | M1, M2, M3 | ON | 1%–100% |

In the example of Table 1, seven voltage windows are defined (although it should be understood that more or fewer voltage windows may be defined depending on the number of transistors 208 included in the output stage 116 in one or more other embodiments). In the −3.01 V to −4 V voltage window, transistors M1, M2, and M3 are driven in the 'off' state. In the −2.01 V to −3 V voltage window, transistors M1 and M2 are driven in the 'off' state. In the −1.01 V to −2 V voltage window, transistors M1 is driven in the 'off' state. In the 1.01 V to 2 V voltage window, transistors M1 is driven in the 'on' state. In the 2.01 V to 3 V voltage window, transistors M1 and M2 are driven in the 'on' state. In the 3.01 V to 4 V voltage window, transistors M1, M2, and M3 are driven in the 'on' state. In the −1 V to 1 V voltage window, no drive current is applied to the transistors 208. It should be understood that, after driving a given group of transistors 208 in the 'on' state, the same group of transistors 208 would be subsequently driven in the 'off' state (e.g., rather than subsequently driving fewer transistors 208 in the 'off' state, which could result in an undesirable short), though not necessarily with the same drive current.

The percentage of full drive current to be used to drive the transistor or group of transistors corresponding to a given voltage window may be determined based on voltage level of the control signal $V_{PWM}$ within that window. For example, the drive current may scale linearly with the voltage magnitude of $V_{PWM}$ within a given voltage window, with the lower bound of the voltage window corresponding to at or around 1% drive current and the upper bound of the voltage window corresponding to at or around 100% drive current. For example, considering the voltage window of 1.01 V to 2 V in which the transistor M1 is driven in the on state, the drive current is 1% when the voltage of $V_{PWM}$ is 1.01 V, 10% when the voltage of $V_{PWM}$ is 1.1 V, 25% when the voltage of $V_{PWM}$ is 1.25 V, 50% when the voltage of $V_{PWM}$ is 1.5 V, 75% when the voltage of $V_{PWM}$ is 1.75 V, and 100% when the voltage of $V_{PWM}$ is 2 V. In one or more embodiments, the maximum drive current may be between around −5 A to around 5 A, as a non-limiting example.

Figure 5:
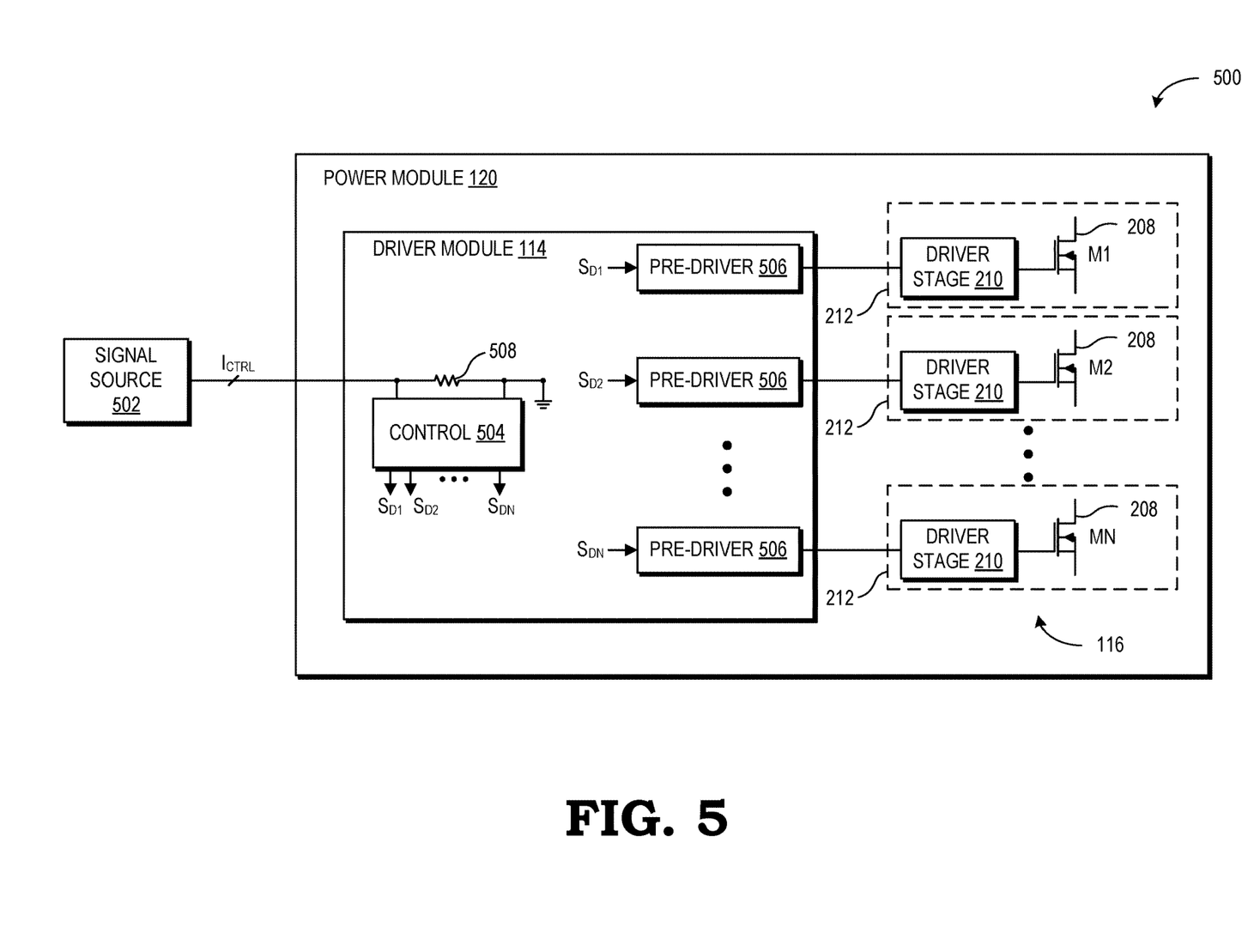
FIG. 5 is a block diagram illustrating circuitry that includes a driver module configured to control segmented output driver stages for a set of output transistors arranged in parallel based on a detected current of a received control signal, in accordance with various embodiments.

FIG. 5 shows an example of circuitry 500 that includes a power module having segmented output driver stages that are controlled by a control module based on signal characteristics that include the control signal current level. One or more elements of the circuitry 500 may correspond to similar elements described above with reference to FIGS. 1 and 2, where such like elements are denoted using like reference numerals in the present example. Aspects of such elements that are already described above may not necessarily be repeated here for sake of brevity. For example, the power module 120 of the circuitry 500 may correspond to be an example embodiment of the power module 120 of FIGS. 1, 2, and 3. As another example, the signal source 502 may correspond to an example embodiment of the communication circuitry 112 of FIGS. 1 and 2 or the signal source 302 of FIG. 3.

In the present example, the power module 120 includes a driver module 114 and an output stage 116 having multiple segments 212, each including an output driver stage 210 and a transistor 208. The driver module 114 may include a control module 504, a resistance 508, and pre-drivers 506, where each pre-driver 506 is coupled to a respectively different segment 212. For example, the power module 120 may include N pre-drivers 506 in the driver module 114, N segments 212, N driver stages 210, and N transistors 208 (denoted M1, M2 . . . . MN), where N is a non-zero positive integer. In accordance with various embodiments, the driver stages 210 may be current mode drivers or voltage mode drivers, as non-limiting examples. Each of the transistors 208 may include a control terminal (e.g., gate terminal) coupled a respective output driver stage of the output driver stages 210, a first current-carrying terminal (e.g., a source terminal or a drain terminal) coupled to a voltage supply (e.g., the voltage supplies 102, 104, FIGS. 1, 2) and a second current-carrying terminal (e.g., a source terminal or a drain terminal) coupled to an output node (e.g., the output node 118, FIGS. 1, 2).

The control module 504 may be configured to measure the current and polarity of a control signal $I_{CTRL}$ from a signal source 502. The signal source 502 may be an "external" signal source, at least in that the signal source 502 may be disposed in a package or module that is separate from the power module 120. The signal source 502 may be configured to set the current level and polarity at which to generate the control signal $I_{CTRL}$, based on which of the transistors 208 are to be driven, the state in which those transistors are to be driven, and the drive current to be used when driving those transistors. The signal source 402 may output the control signal $I_{CTRL}$ to an input (e.g., a single input terminal) of the driver module 114. The control signal $I_{CTRL}$, may pass through the resistance 508, and the control module 504 may be configured to measure the voltage drop across the resistance 508 (e.g., using a comparator) and to determine the current of the control signal $I_{CTRL}$ based on the measured voltage drop and the nominal resistance value of the resistance 508. The control module 504 may additionally include a polarity detector configured to determine a polarity of the control signal $I_{CTRL}$. Based on the detected current level and polarity of the control signal $I_{CTRL}$, the control module 504 may determine which of the transistors 208 are to be driven, the state in which those transistors are to be driven (an 'on' state or an 'off' state), and the drive current to be used when driving those transistors. The control module 504 may then selectively control the pre-drivers 506 based on the detected current level and polarity of the control signal $I_{CTRL}$.

The control module 504 may include logic circuitry configured to output sets of control signals $S_{D1}, S_{D2} \ldots S_{DN}$ to corresponding pre-drivers of the pre-drivers 506 to selectively activate and control the pre-drivers 506. The logic circuitry of the control module 504 may generate the control signals $S_{D1}, S_{D2} \ldots S_{DN}$ based on the current level and polarity of the control signal $I_{CTRL}$. For example, the logic circuitry of the control module 504 may determine which of a number of defined current windows include the determined current of the control signal $I_{CTRL}$, and may determine the which of the transistors 208 are to be driven (e.g., achieved via selective activation of the pre-drivers 506) based on the determined current window. For example, the logic circuitry of the control module 504 may determine whether the transistors 208 are to be driven in an 'on' state or an 'off' state based on the determined polarity of the control signal $I_{CTRL}$. For example, the logic circuitry of the control module 504 may determine the drive current to be applied when driving the transistors 208 based on the determined current level of the control signal $I_{CTRL}$.

In one or more embodiments, each of the pre-drivers 506 may include a current mirror, and each of the sets of control signals $S_{D1}$, $S_{D2}$ . . . . $S_{DN}$ may include one or more control signals that are provided to control terminals of respective switches disposed at outputs of the current mirrors, where a given pre-driver 506 is considered to be activated when the received control signal it receives causes the switch at the output of the given pre-driver 506 to be closed and is considered to be deactivated when that control signal causes that switch to open. In one or more embodiments, each of the sets of control signals $S_{D1}$, $S_{D2}$ . . . . $S_{DN}$ may additionally include one or more control signals configured to control an amount of current gain applied to signals output by the corresponding pre-driver 506, so as to control the amount of drive current used to drive the transistors 208. In one or more embodiments, current application current amplification may be applied to signals used to drive the transistors 208 by either the predrivers 506 or the output driver stages 210. Current-based driver control techniques of the present example may be advantageous, at least because they are less susceptible to noise than some voltage-based techniques.

It should be understood that the implementation of the control module 504 in the present example is intended to be illustrative and non-limiting. For example, in one or more other embodiments, the control module 504 may use other techniques for determining the current level of the control signal $I_{CTRL}$, such as window comparator based techniques or ADC based techniques.

As a non-limiting example, the control module 504 may be configured to control the pre-drivers 506 to selectively drive one or more of the transistors 208 via the output driver stages 210 in accordance with Table 2, below.

TABLE 2

| $I_{CTRL}$ Current (μA) | Transistors to be Driven | Transistor State | Drive Current (% of Max) |
|---|---|---|---|
| −301 to −400 | M1, M2, M3 | OFF | 1%-100% |
| −201 to −300 | M1, M2 | OFF | 1%-100% |
| −100 to 100 | NONE | N/A | NONE |
| 101 to 200 | M1 | ON | 1%-100% |
| 201 to 300 | M1, M2 | ON | 1%-100% |
| 301 to 400 | M1, M2, M3 | ON | 1%-100% |

In the example of Table 2, seven current windows are defined (although it should be understood that more or fewer current windows may be defined depending on the number of transistors 208 included in the output stage 116 in one or more other embodiments). In the −301 μA to −400 μA current window, transistors M1, M2, and M3 are driven in the 'off' state. In the −201 μA to −300 μA current window, transistors M1 and M2 are driven in the 'off' state. In the −101 μA to −200 μA current window, transistors M1 is driven in the 'off' state. In the 101 μA to 200 μA current window, transistors M1 is are driven in the 'on' state. In the 201 μA to 300 μA current window, transistors M1 and M2 are driven in the 'on' state. In the 301 μA to 400 μA current window, transistors M1, M2, and M3 are driven in the 'on' state. In the −100 μA to 100 μA current window, no drive current is applied to the transistors 208. It should be understood that, after driving a given group of transistors 208 in the 'on' state, the same group of transistors 208 would be subsequently driven in the 'off' state (e.g., rather than subsequently driving fewer transistors 208 in the 'off' state, which could result in an undesirable short), though not necessarily with the same drive current.

The percentage of full drive current to be used to drive the transistor or group of transistors corresponding to a given current window may be determined based on current level of the control signal $I_{CTRL}$ within that window. For example, the drive current may scale linearly with the current magnitude of $I_{CTRL}$ within a given voltage window, with the lower bound of the current window corresponding to 1% drive current and the upper bound of the current window corresponding to 100% drive current. For example, considering the current window of 101 μA to 200 μA in which the transistor M1 is driven in the on state, the drive current is 1% when the current of $I_{CTRL}$ is 101 HA, 10% when the current of $I_{CTRL}$ is 110 HA, 25% when the current of $I_{CTRL}$ is 125 μA, 50% when the current of $I_{CTRL}$, is 150 HA, 75% when the current of $I_{CTRL}$ is 175 HA, and 100% when the current of $I_{CTRL}$ is 200 A. In one or more embodiments, the maximum drive current may be between around −5 A to around 5 A, as a non-limiting example.

Figure 6:
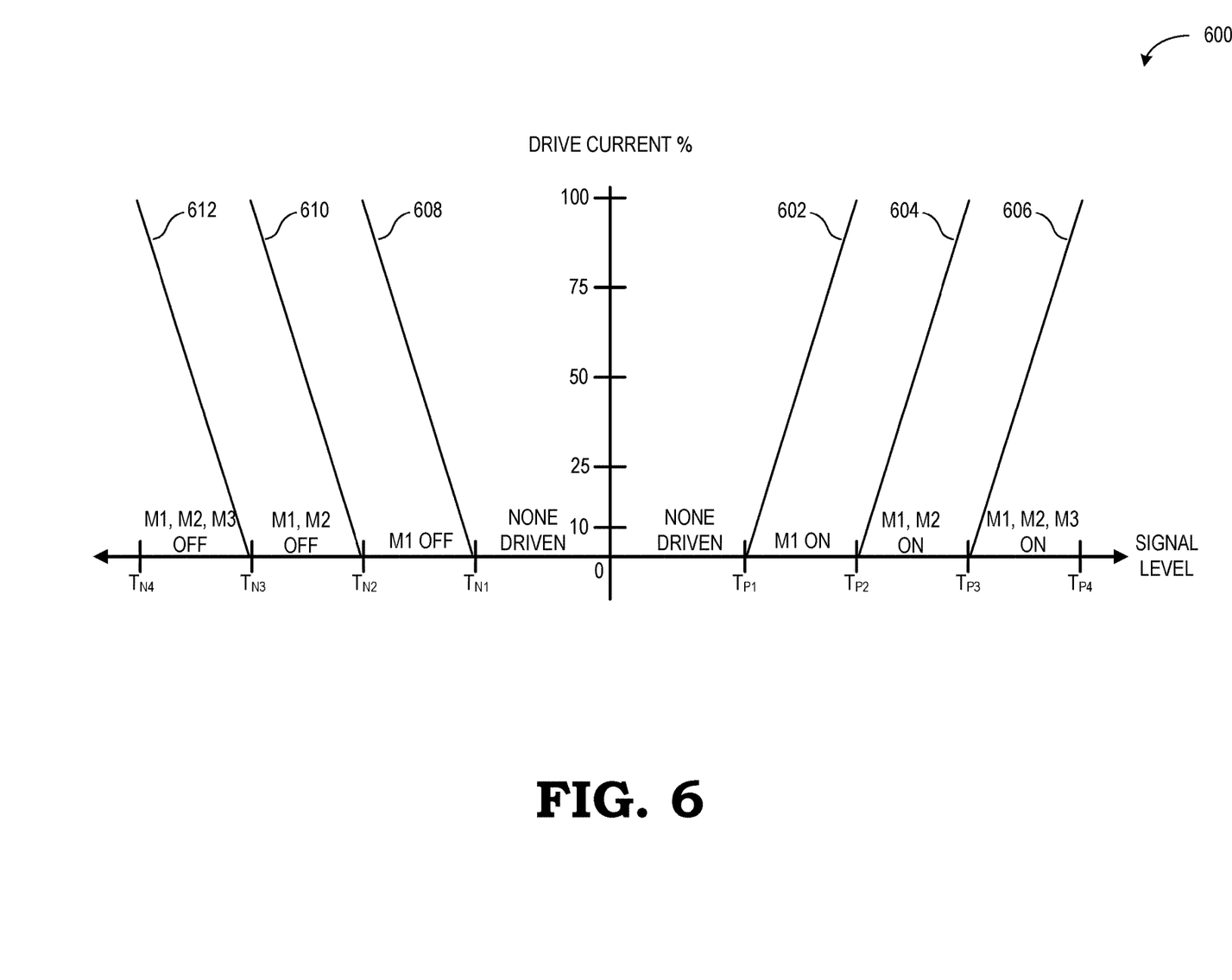
FIG. 6. is a chart representing a control scheme for a driver module, such as the driver modules of FIGS. 1-5, in which a detected signal level (voltage or current) is used to determine a drive strength and to identify which output transistors are to be driven on or off using the determined drive strength, in accordance with various embodiments.

FIG. 6 shows a chart 600 illustrating a control scheme by which a power module (e.g., one or more embodiments the power module 120 of FIGS. 1-5) may determine which transistors of a set of parallel transistors (e.g., transistors 208 of the output stage 116 of FIGS. 1-5) to drive in an 'on' state or an 'off' state, and a percentage of maximum drive current to be used to drive those transistors in the 'on' state or the 'off' state. In the present example, three transistors, denoted as M1, M2, M3, are selectively driven using the control scheme. It should be understood that this is a non-limiting example and that more or fewer transistors may be driven in accordance with one or more other embodiments.

The chart 600 includes a horizontal axis representing the signal level (e.g., voltage level or current level as non-limiting examples) of a control signal (e.g., control signals SIG of FIG. 3, $V_{PWM}$ of FIG. 4, $I_{CTRL}$ of FIG. 5), and a vertical axis representing the percentage of maximum drive current with which the control module of the power module configured is to drive transistors (e.g., transistors 208 of FIGS. 2-5) of an output stage (e.g., output stage 116 of FIGS. 1-5) of the power module based on the signal level of the control signal. As shown in the chart 600, a number of signal level windows (e.g., voltage windows or current windows as non-limiting examples) are defined relative to predefined threshold signal levels $T_{P1}$, $T_{P2}$, $T_{P3}$, $T_{P4}$, $T_{N1}$, $T_{N2}$, $T_{N3}$, $T_{N4}$.

In a first window defined as $T_{P1}$<SIGNAL LEVEL≤$T_{P2}$, a linear relationship between signal level and drive current % is represented by the line 602. When the signal level is in the first window, the transistor M1 is driven in the 'on' state, and the applied drive current scales linearly within the first window from $T_{P1}$ (e.g., at which around 1% maximum drive current is applied) to $T_{P2}$ (e.g., at which around 100% maximum drive current is applied).

In a second window defined as $T_{P2}$<SIGNAL LEVEL≤$T_{P3}$, a linear relationship between signal level and drive current % is represented by the line 604. When the signal level is in the second window, the transistors M1 and M2 are driven in the 'on' state, and the applied drive current scales linearly within the second window from $T_{P2}$ (e.g., at which around 1% maximum drive current is applied) to $T_{P3}$ (e.g., at which around 100% maximum drive current is applied).

In a third window defined as $T_{P3}$<SIGNAL LEVEL≤$T_{P4}$, a linear relationship between signal level and drive current % is represented by the line 606. When the signal level is in the third window, the transistors M1, M2, and M3 are driven in the 'on' state, and the applied drive current scales linearly within the third window from $T_{P3}$ (e.g., at which around 1% maximum drive current is applied) to $T_{P4}$ (e.g., at which around 100% maximum drive current is applied).

In a fourth window defined as $T_{N1}$>SIGNAL LEVEL≥$T_{N2}$, a linear relationship between signal level and drive current % is represented by the line 608. When the signal level is in the fourth window, the transistor M1 is driven in the 'off' state, and the applied drive current scales linearly within the fourth window from $T_{N1}$ (e.g., at which around 1% maximum drive current is applied) to $T_{N2}$ (e.g., at which around 100% maximum drive current is applied).

In a fifth window defined as $T_{N2}$>SIGNAL LEVEL≥$T_{N3}$, a linear relationship between signal level and drive current % is represented by the line 610. When the signal level is in the fifth window, the transistors M1 and M2 are driven in the 'off' state, and the applied drive current scales linearly within the fifth window from $T_{N2}$ (e.g., at which around 1% maximum drive current is applied) to $T_{N3}$ (e.g., at which around 100% maximum drive current is applied).

In a sixth window defined as $T_{N3}$>SIGNAL LEVEL≥$T_{N4}$, a linear relationship between signal level and drive current % is represented by the line 612. When the signal level is in the sixth window, the transistors M1, M2, and M3 are driven in the 'off' state, and the applied drive current scales linearly within the sixth window from $T_{N3}$ (e.g., at which around 1% maximum drive current is applied) to $T_{N4}$ (e.g., at which around 100% maximum drive current is applied).

In a seventh window defined as $T_{N1}$≤SIGNAL LEVEL≤$T_{P1}$, none of the transistors are driven and no drive current is applied. In one or more embodiments, $T_{N1}=T_{P1}=0$, as a non-limiting example. In one or more embodiments, the signal level range in the seventh window may act as a keep out region, as the transistors 208 are typically to be driven in one of the 'on' state or the 'off' state during normal operation of the power module 120.

In one or more embodiments, such as those corresponding to the example of Table 1 and FIG. 4 described above, the thresholds $T_{P1}$, $T_{P2}$, $T_{P3}$, $T_{P4}$ may correspond to voltage thresholds of 1 V, 2 V, 3 V, 4 V and the thresholds $T_{N1}$, $T_{N2}$, $T_{N3}$, $T_{N4}$ may correspond to voltage thresholds of −1 V, −2 V, −3 V, −4 V. In one or more other embodiments, such as those corresponding to the example of Table 2 and FIG. 5 described above, the thresholds $T_{P1}$, $T_{P2}$, $T_{P3}$, $T_{P4}$ may correspond to current thresholds of 100 μA, 200 μA, 300 μA, 400 μA and the thresholds $T_{N1}$, $T_{N2}$, $T_{N3}$, $T_{N4}$ may correspond to voltage thresholds of −100 μA, −200 μA, −300 μA, −400 μA.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power module comprising:
   a plurality of transistors each respectively having a first current-carrying terminal coupled to a voltage supply, a second current-carrying terminal coupled to an output node, and a control terminal;
   a plurality of output driver stages each coupled to the control terminal of a respectively different transistor of the plurality of transistors; and
   a driver module comprising:
      a plurality of pre-drivers each coupled to a respectively different output driver stage of the plurality of output driver stages; and
      a control module having an input and having a plurality of outputs coupled to the plurality of pre-drivers, wherein the control module is configured to receive a control signal at the input and to selectively control the plurality of pre-drivers to drive at least a subset of the plurality of transistors via the plurality of output driver stages based on the control signal.

2. The power module of claim 1, wherein the control module is configured to receive the control signal from a signal source that is separate from the power module.

3. The power module of claim 2, wherein the control module determines the subset of the plurality of transistors to be driven, a state in which each of the subset of the plurality of transistors is to be driven, and an amount of drive current to be applied when driving the subset of the plurality of transistors based on a signal level of the control signal.

4. The power module of claim 3, wherein the signal level of the control signal is a voltage level of the control signal, and the control signal is a pulse width modulation signal.

5. The power module of claim 4, wherein the control module comprises:
   a plurality of window comparators configured to receive the pulse width modulation signal; and
   a decoder configured to receive one or more outputs from the plurality of window comparators, and to determine the subset of the plurality of transistors to be driven, a state in which each of the subset of the plurality of transistors is to be driven, and an amount of drive current to be applied when driving the subset of the plurality of transistors based on the one or more outputs of the plurality of window comparators.

6. The power module of claim 3, wherein the signal level of the control signal is a current level of the control signal.

7. The power module of claim 6, wherein the control module comprises:
   a polarity detector configured to determine a polarity of the control signal;
   a current detector configured to determine the current level of the control signal; and
   logic circuitry configured to control the pre-drivers based on the current level and the polarity.

8. The power module of claim 7, wherein the pre-drivers comprise a plurality of current mirrors, and the logic circuitry is configured to selectively activate outputs of the plurality of current mirrors based on the current level.

9. A power inverter comprising:
a driver control module comprising communication circuitry configured to output a control signal; and
a power module comprising:
a plurality of transistors each respectively having a first current-carrying terminal coupled to a voltage supply, a second current-carrying terminal coupled to an output node, and a control terminal;
a plurality of output driver stages each coupled to the control terminal of a respectively different transistor of the plurality of transistors; and
a driver module coupled to the plurality of output driver stages, wherein the driver module is configured to receive the control signal from the communication circuitry and to drive at least a subset of the plurality of transistors via the plurality of output driver stages based on the control signal.

10. The power inverter of claim 9, wherein the driver module comprises:
a plurality of pre-drivers each coupled to a respectively different output driver stage of the plurality of output driver stages; and
a control module having an input and having a plurality of outputs coupled to the plurality of pre-drivers, wherein the control module is configured to receive the control signal at the input and to selectively control the plurality of pre-drivers to drive the subset of the plurality of transistors via the plurality of output driver stages based on the control signal.

11. The power inverter of claim 10, wherein the control module is configured to determine the subset of the plurality of transistors to be driven, a state in which each of the subset of the plurality of transistors is to be driven, and an amount of drive current to be applied when driving the subset of the plurality of transistors based on a signal level of the control signal.

12. The power inverter of claim 11, wherein the signal level of the control signal is a voltage level of the control signal, and the control signal is a pulse width modulation signal.

13. The power inverter of claim 12, wherein the control module comprises:
a plurality of window comparators configured to receive the pulse width modulation signal; and
a decoder configured to receive one or more outputs from the plurality of window comparators, and to determine the subset of the plurality of transistors to be driven, a state in which each of the subset of the plurality of transistors is to be driven, and an amount of drive current to be applied when driving the subset of the plurality of transistors based on the one or more outputs of the plurality of window comparators.

14. The power inverter of claim 11, wherein the signal level of the control signal is a current level of the control signal.

15. The power inverter of claim 14, wherein the control module comprises:
a polarity detector configured to determine a polarity of the control signal;
a current detector configured to determine the current level of the control signal; and
logic circuitry configured to control the pre-drivers based on the current level and the polarity.

16. The power inverter of claim 15, wherein the pre-drivers comprise a plurality of current mirrors, and the logic circuitry is configured to selectively activate outputs of the plurality of current mirrors based on the current level.

17. A traction inverter for an electric vehicle, the traction inverter comprising:
a motor;
a plurality of power inverters collectively configured to supply three phase power to the motor, each of the plurality of power inverters comprising:
a first driver control module comprising first communication circuitry configured to output a first control signal;
a first power module comprising:
a first plurality of transistors each respectively having a first current-carrying terminal coupled to a first voltage supply, a second current-carrying terminal coupled to an output node, and a first control terminal;
a first plurality of output driver stages each coupled to the first control terminal of a respectively different transistor of the first plurality of transistors; and
a first driver module coupled to the first plurality of output driver stages, wherein the first driver control module is configured to receive the first control signal from the first communication circuitry and to drive at least a subset of the first plurality of transistors via the first plurality of output driver stages based on the first control signal.

18. The traction inverter of claim 17, wherein the first driver module comprises:
a plurality of pre-drivers each coupled to a respectively different output driver stage of the first plurality of output driver stages; and
a control module having an input and having a plurality of outputs coupled to the plurality of pre-drivers, wherein the control module is configured to receive the first control signal at the input and to selectively control the plurality of pre-drivers to drive the subset of the first plurality of transistors via the first plurality of output driver stages based on the first control signal.

19. The traction inverter of claim 17, wherein the control module determines the subset of the first plurality of transistors to be driven, a state in which each of the subset of the first plurality of transistors is to be driven, and an amount of drive current to be applied when driving the subset of the first plurality of transistors based on a signal level of the first control signal.

20. The traction inverter of claim 19, wherein each of the plurality of power inverters has a half bridge configuration, and wherein each of the plurality of power inverters further comprises:
a second driver control module comprising second communication circuitry configured to output a second control signal;
a second power module comprising:
a second plurality of transistors each respectively having a third current-carrying terminal coupled to a second voltage supply, a fourth current-carrying terminal coupled to the output node, and a second control terminal;
a second plurality of output driver stages each coupled to the second control terminal of a respectively different transistor of the second plurality of transistors; and
a second driver module coupled to the second plurality of output driver stages, wherein the second driver module is configured to receive the second control signal from the second communication circuitry and to drive at least a subset of the second plurality of transistors via the second plurality of output driver stages based on the second control signal.

\* \* \* \* \*